United States Patent [19]

Hatakeyama et al.

[11] Patent Number: 5,730,833
[45] Date of Patent: Mar. 24, 1998

[54] IMAGE TRANSFER APPARATUS

[75] Inventors: Seiji Hatakeyama, Shizuoka; Yoshihisa Usami, Kanagawa; Kenichi Nakagawa, Shizuoka, all of Japan

[73] Assignee: Fuji Photo Film Co., Ltd., Kanagawa, Japan

[21] Appl. No.: 797,297

[22] Filed: Feb. 7, 1997

[30] Foreign Application Priority Data

Feb. 8, 1996 [JP] Japan .................. 8-022575

[51] Int. Cl.$^6$ ............................... B32B 31/00
[52] U.S. Cl. .................. 156/540; 156/230; 156/240; 156/582
[58] Field of Search ............... 156/540, 582, 156/230, 303, 303.1, 240, 299; 430/256

[56] References Cited

U.S. PATENT DOCUMENTS

| | | | |
|---|---|---|---|
| 4,060,441 | 11/1977 | Ohta et al. | 156/230 X |
| 5,114,520 | 5/1992 | Wang, Jr. et al. | 156/540 X |
| 5,397,677 | 3/1995 | Schuerwegen et al. | 156/230 X |
| 5,531,854 | 7/1996 | Kerr et al. | 430/256 X |

*Primary Examiner*—James Engel
*Attorney, Agent, or Firm*—Sughrue, Mion, Zinn, Macpeak & Seas, PLLC

[57] ABSTRACT

An image transfer apparatus preventing transfer misregistration is disclosed. The apparatus comprises a driving roller, a following roller, and a carry including a guide plate and a cover film, wherein an image receiving sheet and a photosensitive material, which are overlapped with each other, are sandwiched by the guide plate and the cover film and then nipped between the driving roller and the following roller in the carry so as to be pressed and conveyed, and a pair of beam members extending along a conveying direction of the carry are disposed at the sides of the guide plate with the cover film being placed therebetween and the upper end portions of the beam members are projected from the upper surface of the cover film laid on top of the photosensitive material.

2 Claims, 2 Drawing Sheets

IMAGE TRANSFER APPARATUS

BACKGROUND OF THE INVENTION

1. Field of the Invention

The present invention relates to an image transfer apparatus for making a color proof in a processing process.

2. Description of the Related Art

When a large number of prints are effected by making print plates which are produced from color originals using processing materials such as PS plates or the like, a four colored negative (or half-tone positive) is usually formed from the color originals by using a color scanner or the like. Thereafter, the negative is subjected to the processes of mounting, returning, retouching and the like and forms a single positive which is comprised of four colors. The print finish of the single positive can be checked by making proof prints so that a formal print of the single positive is effected. In this case, in order to obtain an excellent print finish, checking functions such as checking of scanner separation (or resolution) in a process of forming a half-tone negative or positive, checking of mounting or the like in a process of forming a single positive, and checking of an orderer of print in a process of proof printing and the like are required. To this end, a color proof (i.e., a proof print) for checking is made.

For making the color proof, it is known to use a silver salt photographic photosensitive material, an electronic-photographic photosensitive material, a photosensitive material using photopolymer and the like. Some photosensitive layers use color dye or pigments so as to form color images. A negative-positive process or a positive-positive process can be selected depending on the purpose of the use of the color proof.

As an example, a method of forming a color proof may be provided in which an image exposing process is applied to a photosensitive material, a developing process is effected on the exposed photosensitive material and the generated image due to the developing process is transferred to an image receiving sheet. In this case, four photosensitive materials each having a photosensitive layer on a substrate are used to form a color image comprised of yellow, magenta, cyan and black. The photosensitive materials are transferred in turn to the same image receiving sheet to form a multicolor image.

In this case, image transferring is effected by various methods such as simple pressing, simultaneous pressing and heating, and the like. For example, as shown in FIG. 4, there is provided a method in which a photosensitive material 3 having a photosensitive layer and a transfer sheet 5 are sandwiched between the guide plate 7 and the cover film 9 constituting a carry 11 in a state in which the photosensitive material 3 and the transfer sheet 5 are overlapped with each other. The carry 11 can be passed between a pair of rollers 1, one or both of which can be used as a heat roller. As a result, transferring of the photosensitive layer having an image thereon can be effected.

In the above method, because colors of an image which is formed are transferred sequentially to the image receiving sheet one by one, image transfer with high accuracy must be effected. Namely, degree of transfer misregistration must be minimized. As principle factors causing such misregistration as described above, peripheral velocity of a roller pair, pressure distribution, shapes of the rollers, cover materials, friction between sheets or the like have been considered.

However, conventionally, in generally used transfer machine, because transfer misregistration preventing method is not adopted in a transfer portion of the transfer machine, the transfer misregistration has been only reduced to 200 μm at most. In addition, there has been a drawback in that a portion of the sheet which is nipped by a roller pair is stretched. As a result, because both an image sheet and an image receiving sheet are made of a flexible material, drawbacks arise in that when an image transfer process is effected, namely, when an image is pressed by heat rollers, the image sheet and the image receiving sheet which are overlapped are warped, misregistration is caused between the sheets when they are conveyed, and wrinkles or the like are caused to the sheets as well so that sharpness of the transferred image is deteriorated. Specifically, since four times of image transfer process is usually required when a color proof is printed, there have been problems in that transfer misregistration and/or color unevenness are caused to the transferred image.

In view of the aforementioned facts, it is an object of the present invention to provide an image transfer apparatus in which wrinkles or the like are not caused to the image transfer sheet and the image receiving sheet in an overlapped state thereof or transfer misregistration is not caused between the sheets. Namely, it is an object of the present invention to prevent transfer misregistration or color unevenness during an image transferring.

SUMMARY OF THE INVENTION

In accordance with a first aspect of the present invention, there is provided an image transfer apparatus, comprising a driving roller, a following roller, and a carry including a guide plate and a cover film, wherein an image receiving sheet and a photosensitive material, which are overlapped with each other, are sandwiched by the guide plate and the cover film and then nipped between the driving roller and the following roller in the carry so as to be pressed and conveyed, and a pair of beam members extending along a conveying direction of the carry are disposed at the sides of the guide plate with the cover film being placed therebetween and the upper end portions of the beam members are projected from the upper surface of the cover film laid on top of the photosensitive material.

In accordance with a second aspect of the present invention, there is provided an image transfer apparatus according to the first aspect, wherein the outer diameter of the axial central portion of the following roller contacting the cover film is made larger than that of each of the axial end portions of the following roller.

In an image transfer apparatus thus formed, when the carry passes between the rollers, since beam members are projected from the upper surface of the cover film, the rotational force of the driving roller is transmitted to the following roller via the beam members. Accordingly, because the reaction force from the following roller does not act on the cover film, no difference is made between the conveying amount of the guide plate and the cover film so that displacement is not caused to the relative position of the guide plate and the cover film.

Further, in the image transfer apparatus, since the outer diameter of the axial central portion of the roller contacting the cover film is made larger, the beam members provided at the carry and the roller are cooperated with each other so as to press the cover film. Accordingly, the pressing force from the following roller acting on the cover film is uniformly parted to the left and right directions of the cover film from the widthwise central portion thereof so that pressure distribution on the carry in the widthwise direction thereof can be uniformed.

DETAILED DESCRIPTION OF THE PREFERRED EMBODIMENT

Figure 1:
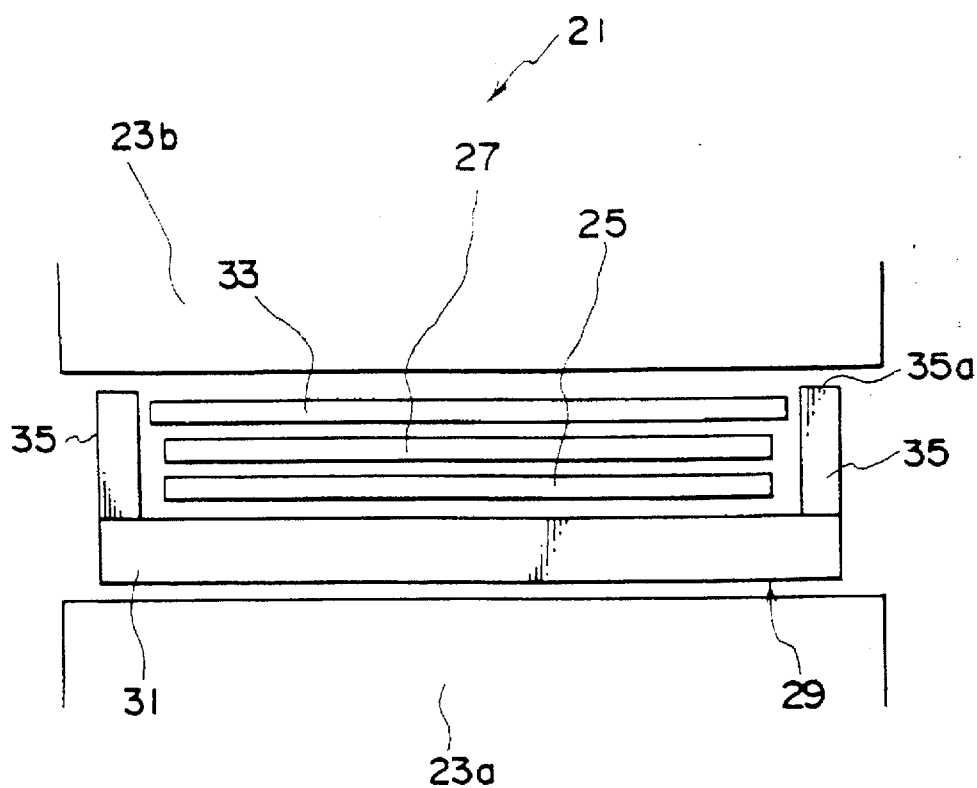
FIG. 1 is a front view of a transfer portion of an image transfer apparatus according to the present invention at the time of an image transfer.
Figure 2:
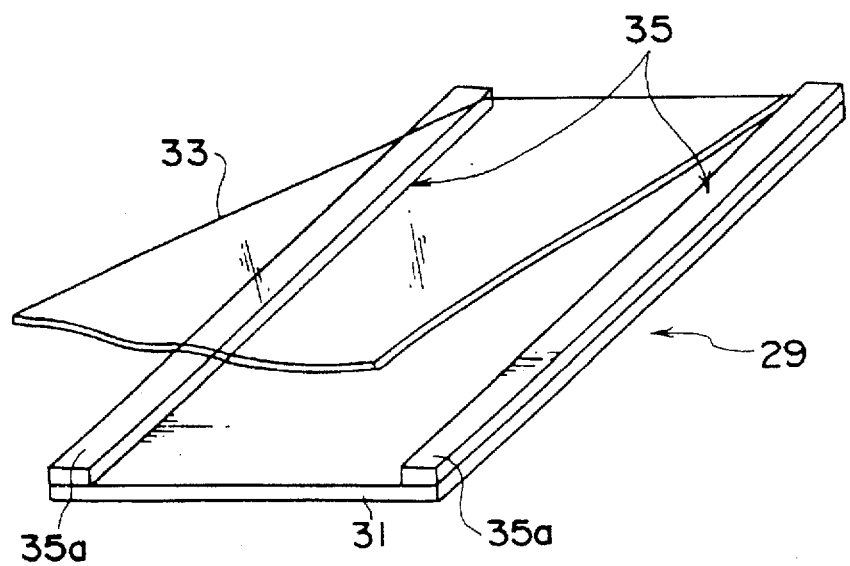
FIG. 2 is a perspective view of a carry shown in FIG. 1.

Hereinafter, a preferred embodiment of an image transfer apparatus according to the present invention will be described in detail with reference to the drawings. FIG. 1 is a front view of a transfer portion of an image transfer apparatus according to the present invention at the time of an image transfer and FIG. 2 is a perspective view of a carry shown in FIG. 1.

A pair of rollers 23a and 23b are provided in an image transfer apparatus 21. The lower roller 23a is a driving roller and the upper roller 23b is a following roller. A heater (not shown) is assembled in the rollers 23a and 23b, respectively and allows for the transfer temperature of about 125° C. A carry 29, which carries an image receiving sheet 25 and a photosensitive material 27, is nipped by the rollers 23a and 23b. The carry 29 nipped by the rollers is pressed and heated by the rollers 23a and 23b and thereby conveyed.

A rigid guide plate 31 is provided at the carry 29. The guide plate 31 is made of, for example, an aluminum thin plate having high heat-conductivity. By considering heat-conductivity and rigidity, the thickness of the guide plate 31 is set to be about 0.5 mm. A cover film 33 is provided on the upper surface of the guide plate 31 such that the front end portion of the cover film 33 is adhered to the front end of the guide plate 31. Accordingly, the image receiving sheet 25 and the photosensitive material 27 are sandwiched between the guide plate 31 and the cover film 33 and then carried.

By considering heat-conductivity and operability, for example, a plastic resin such as a PET resin or the like having a thickness of about 100 μm may be used for the cover film 33. For example, silicon coating, fluorine resin or the like may be applied to the surface of the cover film 33 to prevent the cover film 33 from being adhered to the photosensitive material 27. The cover film 33 presses the photosensitive material 27 and the image receiving sheet 25 to the guide plate 31 so that misregistration of the photosensitive material 27 and the image receiving sheet 25 are prevented, dust adhered to the rollers 23a and 23b is prevented from being adhered to the photosensitive material 27 and the image receiving sheet 25, and an adhesive of an adhesive layer in the image receiving sheet 25 is prevented from being adhered to the rollers 23a and 23b.

Beam members 35, which are formed in band plate-shapes, are provided at both sides of the guide plate 31 in the transverse direction thereof (i.e., axial directions of the rollers 23a and 23b). The beam members 35 are also formed along the longitudinal direction (i.e., the conveying direction) of the guide plate 31. The width of the above cover film 33 is made slightly smaller than the distance between the beam members 35 so that the cover film 33 is placed between the beam members 35 and is laid over the guide plate 31. More specifically, when the cover film 33 is laid over the guide plate 31, the beam members 35 are exposed at the sides of the cover film 33.

In the present embodiment, the image receiving sheet 25, the photosensitive material 27, and the cover film 33, the sum of thicknesses of which being 0.3 mm, may be used. Conversely, the beam members 35 are formed in thickness of 0.5 mm. In this way, an upper end portion 35a of each of the beam members 35 projects slightly from the upper surface of the cover film 33. Further, a gap between the cover film 33 and each of the beam members 35 is 2 mm so that each of the image receiving sheet 25, the photosensitive material 27 and the cover film 33 does not contact the beam members 35.

An operation of the image transfer apparatus 21 thus constituted will be described.

A color proof is formed as a multicolor image such that color images, which are comprised of yellow, magenta, cyan and black, respectively, are formed by using four sheets of photosensitive materials and then transferred sequentially to the same image receiving sheet 25. At this time, the image receiving sheet 25 and the photosensitive material 27 are supported by the carry 29 and are passed between the rollers 23a and 23b in a state in which the image receiving sheet 25 and the photosensitive material 27 are overlapped with each other.

When the carry 29 passes between the rollers 23a and 23b, because the beam members 35 project slightly from the upper surface of the cover film 33, the beam members 35 which are provided at right and left sides of the guide plate 31 are mainly pressed by the rollers 23a and 23b. The rotational force generated by the roller pair 23a and 23b, which have mainly pressed the beam members 35, is transmitted from the lower roller 23a to the upper roller 23b via the beam members 35. At this time, in a carry such as a conventional one in which the beam members 35 are not provided, the carry is pressed directly by the rollers 23a and 23b and is conveyed. In this state, the rotational force of the roller 23a is transmitted to the roller 23b via the carry 29 and the cover film 33 thereby receives the reaction force from the roller 23b. Accordingly, a small difference is made between the conveying amounts by the guide plate 31 and the cover film 33 so that displacement is caused to the relative position of the guide plate 31 and the cover film 33 in conveying directions thereof.

In this way, when displacement is caused to the relative position of the guide plate 31 and the cover film 33, displacement is thereby caused to the relative position of the image receiving sheet 25 and the photosensitive material 27 which are sandwiched between the guide plate 31 and the cover film 33. In this way, wrinkles and transfer misregistration as a whole are increased. Conversely, in the present invention, by providing the beam members 35 at both sides of the guide plate 31, the rotational force of the roller 23a can be transmitted directly to the roller 23b via the beam members 35. Accordingly, because the cover film 33 does not receive the reaction force from the roller 23b, no difference is made between the conveying amounts by the guide plate 31 and the cover film 33 so that displacement is not caused to the relative position of the guide plate 31 and the cover film 33 in the conveying directions thereof.

In this way, in accordance with the aforementioned image transfer apparatus 21, because the beam members 35, which project slightly from the upper surface of the cover film 33, are provided at the sides of the carry 29 nipped by the rollers 23a and 23b, the rotational force of the roller 23a is transmitted directly to the roller 23b via the beam members 35 so that the reaction force (i.e., the rotational load) from the roller 23b does no longer act on the cover film 33.

Therefore, misregistration is not caused to the relative position of the cover film 33 and the guide plate 31 in the conveying directions thereof. As a result, misregistration is not caused to the image receiving sheet 25 and the photosensitive material 27 so that wrinkles and transfer misregistrations causing to the image receiving sheet 25 and the photosensitive material 27 can be minimized.

Figure 3:
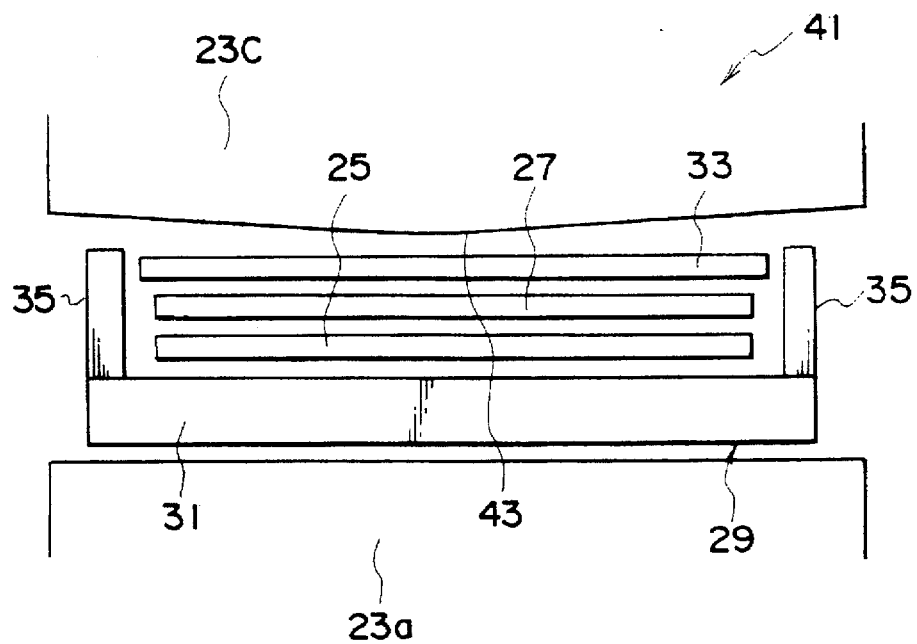
FIG. 3 is a front view of a transfer portion of an image transfer apparatus according to another embodiment of the present invention.
Figure 4:
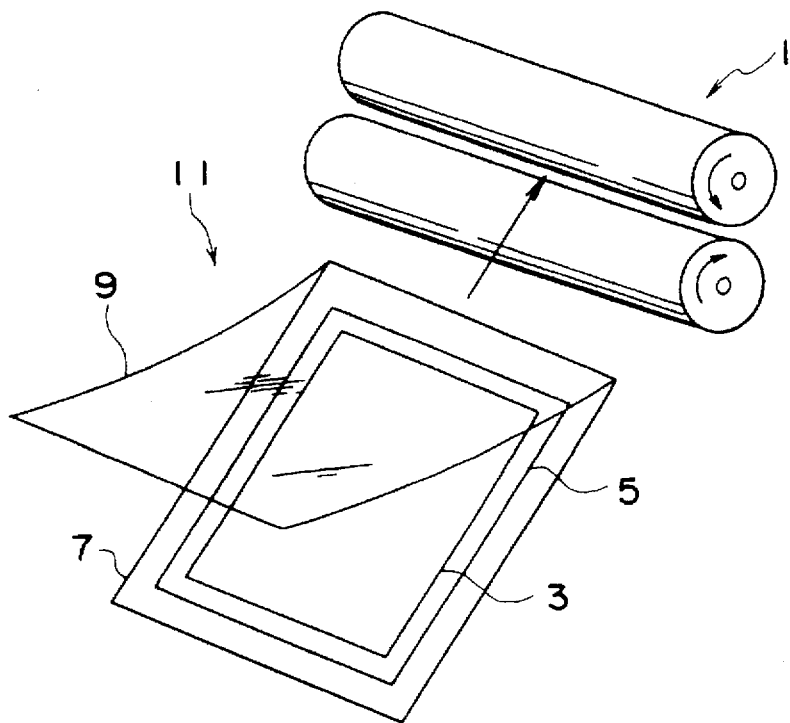
FIG. 4 is a schematic structural view of a conventional image transfer apparatus.

Next, a description of an image transfer apparatus according to another embodiment of the present invention will be given, hereinafter. FIG. 3 shows a front view of a transfer portion of an image transfer apparatus according to another embodiment of the present invention.

An image transfer apparatus 41 according to the present embodiment has the same carry 29 as that described in the above embodiment, and characterized by the shape of the roller 23c contacting the cover film 33. More specifically, the upper roller 23c contacting the cover film 33 is a crown roller in which the outer diameter of the axial central portion of the roller 23c is made larger than that of each of the end portions of the roller 23c. The outer diameter of the central portion 43 of the roller 23c is 0.1 mm larger than that of the end portions of the roller 23c.

In the image transfer apparatus 41, the beam members 35 provided at the carry 29 and the roller 23c are cooperated with each other. The cover film 33 is pressed by the roller 23c in a state in which the end portions of the roller 23c are carried by the beam members 35. The pressing force from the roller 23c, which acts on the cover film 33, is parted uniformly to the left and right directions of the cover film 33 from the widthwise central portion of thereof. Therefore, the pressure distribution, which acts on the carry 29 in the widthwise direction thereof, can be uniformed.

In combination with the above described prevention of wrinkles and transfer misregistration in the conveying direction of the carry 29, those in the widthwise directions of the image receiving sheet 25 and the photosensitive material 27 can be minimized.

What is claimed is:

1. Image transfer apparatus, comprising:

a driving roller, a following roller; and a carry including a guide plate and a cover film, wherein an image receiving sheet and a photosensitive material are overlapped with each other, sandwiched between the guide plate and the cover film in the carry, nipped between the driving roller and the following roller, and pressed and conveyed, and a pair of beam members extending along a conveying direction of the carry are disposed at the sides of the guide plate with the cover film being placed therebetween and the upper end portions of the beam members are projected from the upper surface of the cover film laid on top of the photosensitive material.

2. Image transfer apparatus according to claim 1, wherein the outer diameter of the axial central portion of the following roller contacting the cover film is larger than that of each of the axial end portions of the following roller.

* * * * *